US012732218B2

(12) United States Patent
Sanner et al.

(10) Patent No.: US 12,732,218 B2
(45) Date of Patent: Sep. 8, 2026

(54) RADIO FREQUENCY SWITCH ISOLATION TECHNIQUES, SYSTEMS, AND METHODS

(71) Applicant: pSemi Corporation, San Diego, CA (US)

(72) Inventors: Miles Sanner, San Diego, CA (US); Yaojun Shirley Prevost, Poway, CA (US); Ethan Prevost, Poway, CA (US); Vijay Katta, San Diego, CA (US); Emre Ayranci, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 137 days.

(21) Appl. No.: 18/617,597

(22) Filed: Mar. 26, 2024

(65) Prior Publication Data

US 2025/0309928 A1 Oct. 2, 2025

(51) Int. Cl.
*H03F 3/24* (2006.01)
*H04B 1/04* (2006.01)

(52) U.S. Cl.
CPC ........... *H04B 1/0475* (2013.01); *H03F 3/245* (2013.01); *H04B 1/0483* (2013.01); *H03F 2200/294* (2013.01); *H03F 2200/451* (2013.01)

(58) Field of Classification Search
CPC .... H04B 1/0475; H04B 1/0483; H04B 1/006; H04B 1/005; H03F 3/245; H03F 2200/294; H03F 2200/451; H03K 17/693
See application file for complete search history.

(56) References Cited

U.S. PATENT DOCUMENTS

| | | | | |
|---|---|---|---|---|
| 9,300,286 | B2 * | 3/2016 | Gaynor | H04B 1/18 |
| 9,438,196 | B2 * | 9/2016 | Smith | H03H 7/06 |
| 10,038,409 | B2 | 7/2018 | Nobbe | |
| 10,153,760 | B2 | 12/2018 | Prevost et al. | |
| 10,326,484 | B1 | 6/2019 | Ayranci et al. | |
| 10,447,242 | B2 | 10/2019 | Srirattana | |
| 10,700,658 | B2 * | 6/2020 | Ayranci | H04B 1/0067 |
| 11,159,130 | B2 | 10/2021 | Daruwalla et al. | |
| 11,336,243 | B2 | 5/2022 | Ayranci et al. | |
| 11,336,278 | B2 * | 5/2022 | Hayakawa | H04B 1/40 |
| 11,611,319 | B2 | 3/2023 | Ayranci et al. | |
| 11,742,847 | B2 | 8/2023 | Prevost et al. | |
| 2015/0236748 | A1 | 8/2015 | Nobbe | |
| 2015/0236798 | A1 | 8/2015 | Nobbe | |
| 2018/0145707 | A1 * | 5/2018 | Cheon | H04B 1/0475 |
| 2023/0097428 | A1 | 3/2023 | Guo | |
| 2023/0276418 | A1 | 8/2023 | Bacon | |
| 2023/0283275 | A1 | 9/2023 | Reedy et al. | |

FOREIGN PATENT DOCUMENTS

| | | |
|---|---|---|
| CN | 106664086 A | 5/2017 |
| CN | 107210774 A | 9/2017 |
| CN | 108476028 A | 8/2018 |

* cited by examiner

*Primary Examiner* — John W Poos
(74) *Attorney, Agent, or Firm* — Haynes and Boone, LLP

(57) ABSTRACT

Systems, circuits, and methods are presented for providing RF switching circuits with improved performance, such as increased isolation among signal paths. According to some aspects, an RF switching circuit is disclosed. In some embodiments, the RF switching circuit includes a first switchable signal path; a second switchable signal path; and a shunt circuit connected between the first switchable signal path and the second switchable signal path, wherein the shunt circuit comprises a shunt switch; and an inductor connected in series with the shunt switch.

23 Claims, 9 Drawing Sheets

WITH INDUCTOR
WITHOUT INDUCTOR
m2
IMPROVED ISOLATION
AT DESIRED BAND
ISOLATION (dB)
0
-20
-40
-60
-80
-100
-120
FREQUENCY, GHz
0
1
2
3
4
5
6
7
8
9
10

800
840
IC
802
804
810
Interposer
804
820
PCB
804
830

RADIO FREQUENCY SWITCH ISOLATION TECHNIQUES, SYSTEMS, AND METHODS

BACKGROUND

This disclosure relates to radio frequency switch isolation techniques, systems, and methods.

Radio frequency (RF) signal switches, which also may be referred to as RF switching circuits, are common circuits for routing RF signals between various parts of an RF system, such as between one or more antennas and one or more transmitter and/or receiver circuits in a wireless communication device. For example, RF signal switches are used in such devices as one-way and two-way radios, including cellular telephones and smartphones, and in global positioning system (GPS) devices.

In some applications, an RF signal switch may accommodate communication via two different frequency bands at the same time, e.g., by routing different RF signals via different signal paths within the RF signal switch. For example, in a carrier aggregation (CA) scenario according to fourth generation (4G) Long Term Evolution (LTE) or fifth generation (5G) cellular wireless standards, a device, such as a smartphone, may communicate via more than one carrier at a time in different frequency bands, and there may a number of available carriers, such as at least 5, 10, 15, or more carriers. As known in the art, example LTE or 5G frequency bands may be denoted as B1, B2, B3, B4, B5, etc., including B7 and B40.

It may be desirable for an RF signal switch to provide a certain degree of isolation between different signal paths, but achieving a high degree of isolation between signal paths in an RF switch is challenging with conventional architectures. Accordingly, there is a continuing need for RF signal switches that provide a high degree of isolation between signal paths at a reasonable cost.

SUMMARY

Embodiments of the present disclosure include systems, circuits, and methods for providing sufficient or increased isolation among signal paths in RF signal switches.

In some aspects, an RF switching circuit is disclosed. In some embodiments, the RF switching circuit includes a first switchable signal path; a second switchable signal path; and a shunt circuit connected between the first switchable signal path and the second switchable signal path, wherein the shunt circuit comprises a shunt switch; and an inductor connected in series with the shunt switch.

In some aspects, an RF circuit is disclosed. In some embodiments, the RF circuit includes an RF switching circuit. The RF switching circuit may include a common port; a first switch group connected between the common port and a first output port; a configurable RF signal path; and a second switch group connected between the common port and the configurable RF signal path, wherein the second switch group comprises a shunt switch. The RF circuit may further include at least one inductor comprising an inductor, wherein the shunt switch is configurable to form a shunt path via the inductor.

In some aspects, a method of routing RF signals is disclosed. In some embodiments, the method includes routing a first RF signal using a first signal path; routing a second RF signal using a second signal path; and configuring a shunt circuit connected between the first signal path and the second signal path. The shunt circuit may include a pair of switches connected in series and a shunt switch, wherein the configuring includes setting the shunt switch to an on state to form a path to a system ground via an inductor.

The scope of the present disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

Figure 1:
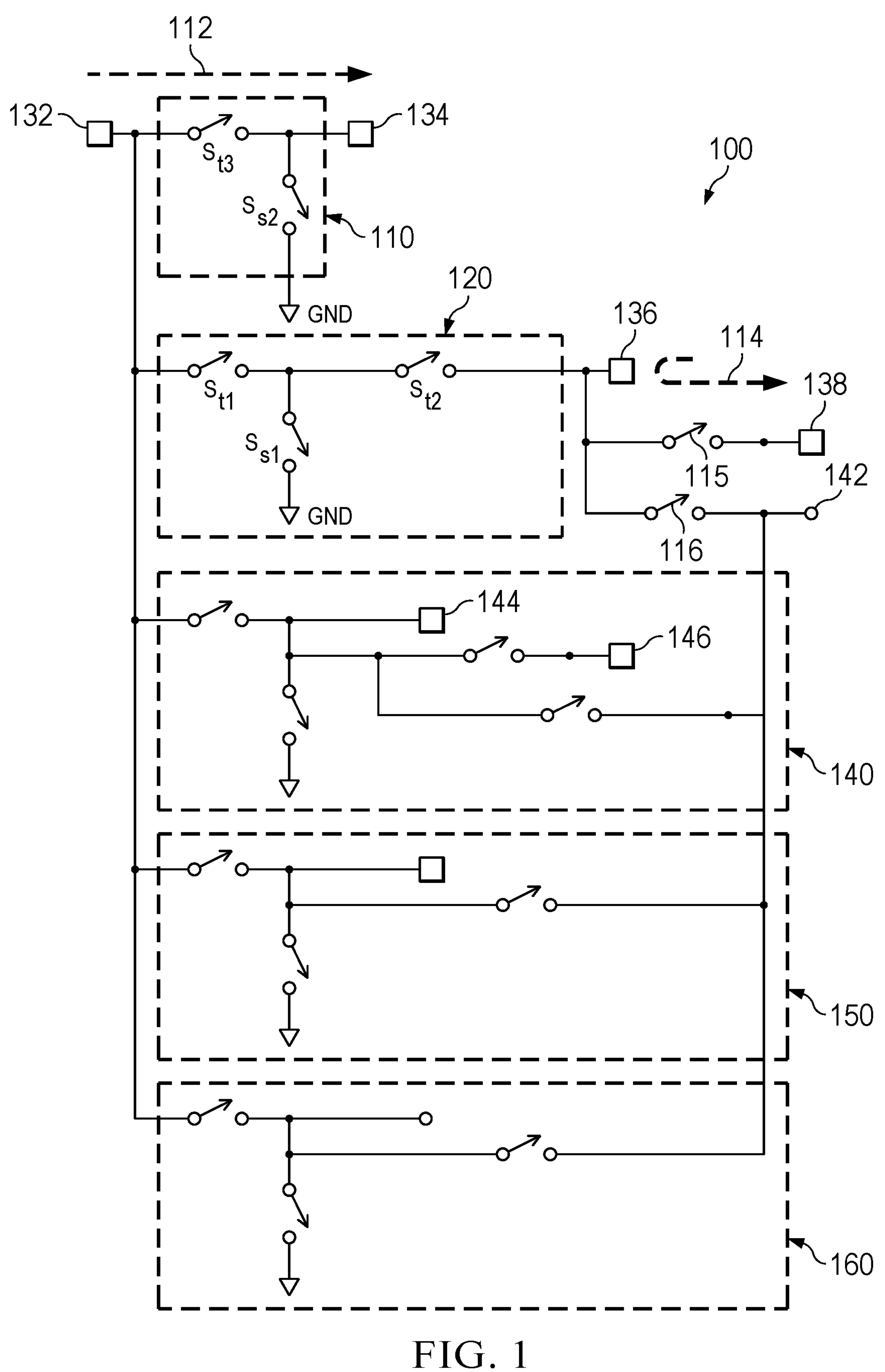
FIG. 1 is an example RF switching circuit, in accordance with one or more embodiments of the present disclosure.

Embodiments of the present disclosure and their advantages are best understood by referring to the detailed description that follows. It is noted that sizes of various components and distances between these components are not drawn to scale in the figures. It should be appreciated that like reference numerals are used to identify like elements illustrated in one or more of the figures.

DETAILED DESCRIPTION

The present disclosure encompasses novel circuits, architectures, systems, and methods that more effectively and efficiently address the configuration and operation of multi-level converter circuits. It will be appreciated that various improvements disclosed herein encompass innovative circuits, hardware components, architectures, and related logic that are applicable to applications beyond multi-level converter circuits.

Exemplary embodiments of RF switching circuits are presented herein. The RF switching circuits achieve a high degree of isolation between signal paths. For example, isolation exceeding 60 decibels (dB) can be achieved between signals on a first signal path and signals on a second signal path over a frequency band accommodating signals using different carriers and frequency bands or sub-bands. In some embodiments, a first signal path may accommodate an RF signal in a first frequency band (e.g., B7), and a second signal path may accommodate an RF signal in a different frequency band (e.g., B40).

FIG. 1 is an example RF switching circuit 100, in accordance with one or more embodiments of the present disclosure. The RF switching circuit 100 includes a number of input/output ports or terminals as shown, including ports 132, 134, 136, 138, and 142. Signal paths may be switchably or selectively formed between various ports, depending on the states of various switches. The RF switching circuit 100 may be used for routing RF signals between different parts of an RF system, such as a cellular smartphone. For example, a transmit signal path may be formed between ports 132 and 134 to carry a signal for transmission from port 132 to 134. A group of switches (or switch group) 110 may be connected between ports 132 and 134. In this embodiment, the switch group 110 includes a through switch $S_{t3}$ and a shunt switch $S_{s2}$ connected as shown. In order to form an RF signal path 112 between ports 132 and 134, the through switch $S_{t3}$ may be set in an on (or closed) state and the shunt switch $S_{s2}$ may be set in an off (or open) state.

In order to form an RF signal path 114 between ports 136 and 138, a switch 115 may be set in an on (closed) state. In some embodiments, the RF signal path 114 may carry an RF received signal or form an RF signal receive path. As shown, the RF switching circuit 100 includes a second switch group 120 connected between the port 132 and the RF signal path 114. The second switch group 120 is configured as a through-shunt-through throw topology to achieve a certain degree of isolation between RF signal path 112 and RF signal path 114. In this embodiment, the second switch group 120 includes through switches $S_{t1}$ and $S_{t2}$ connected in series as shown and a shunt switch $S_{s1}$ connected between the through switches. More specifically, an input of the shunt switch $S_{s1}$ may be connected between the pair of through switches. During operation, the through switches $S_{t1}$ and $S_{t2}$ may be set in an off state and the shunt switch $S_{s1}$ may be set in an on state. Moreover, during operation, the through switch $S_{t3}$ may be set in an on state, and the shunt switch $S_{s2}$ may be set in an off state, thereby forming signal path 112. Continuing with operation, the switch 115 may be set in an on state, thereby forming a signal path 114 between port 136 and 138, and switch 116 may be set in an off state. The RF signal paths 112 and 114 are configurable because RF signal paths are established according to the states of switches in those paths, such as switches 115, $S_{t3}$, and $S_{s2}$.

In some embodiments, the signal path 112 may represent a signal path for signals in a certain 4G or 5G cellular frequency band (such as a the B7 band), and the signal path 114 may represent a signal path for signals in another 4G or 5G cellular frequency band (such as the B40 band). Exemplary ground terminals GND are also illustrated in FIG. 1. The signal paths 112 and 114 are switchable or configurable in the sense that certain switches can be set in an on or off state to establish these signal paths. For example, through switch $S_{t3}$ should be in an on state, $S_{s2}$ should be in an off state, and switch 115 should be in an on state to establish the paths 112 and 114 as shown. The switch groups 110 and 120 are examples of, and may also be referred to, as shunt circuits.

As shown, the RF switching circuit 100 may further include a plurality of switchable RF signal paths in circuit portions 140, 150, and 160. The signal port 132 may be considered as a port common to various signal paths, including paths between port 132 and port 142. A through-shunt-through switch topology may be used to isolate various other signal paths as well, such as to isolate a signal path formed between ports 144 and 146 and the signal path 112.

In some embodiments, parasitic coupling may exist between paths 112 and 114 that limits isolation between signal paths to less than 60 dB in frequency band(s) of interest. The parasitic coupling may be due to capacitive or inductive coupling.

In order to address parasitic coupling and improve isolation, this disclosure recognizes that adding an inductor in series with a shunt branch in a through-shunt-through throw topology may improve isolation between paths. Various embodiments that include inductor configurations are described below.

Figure 2:
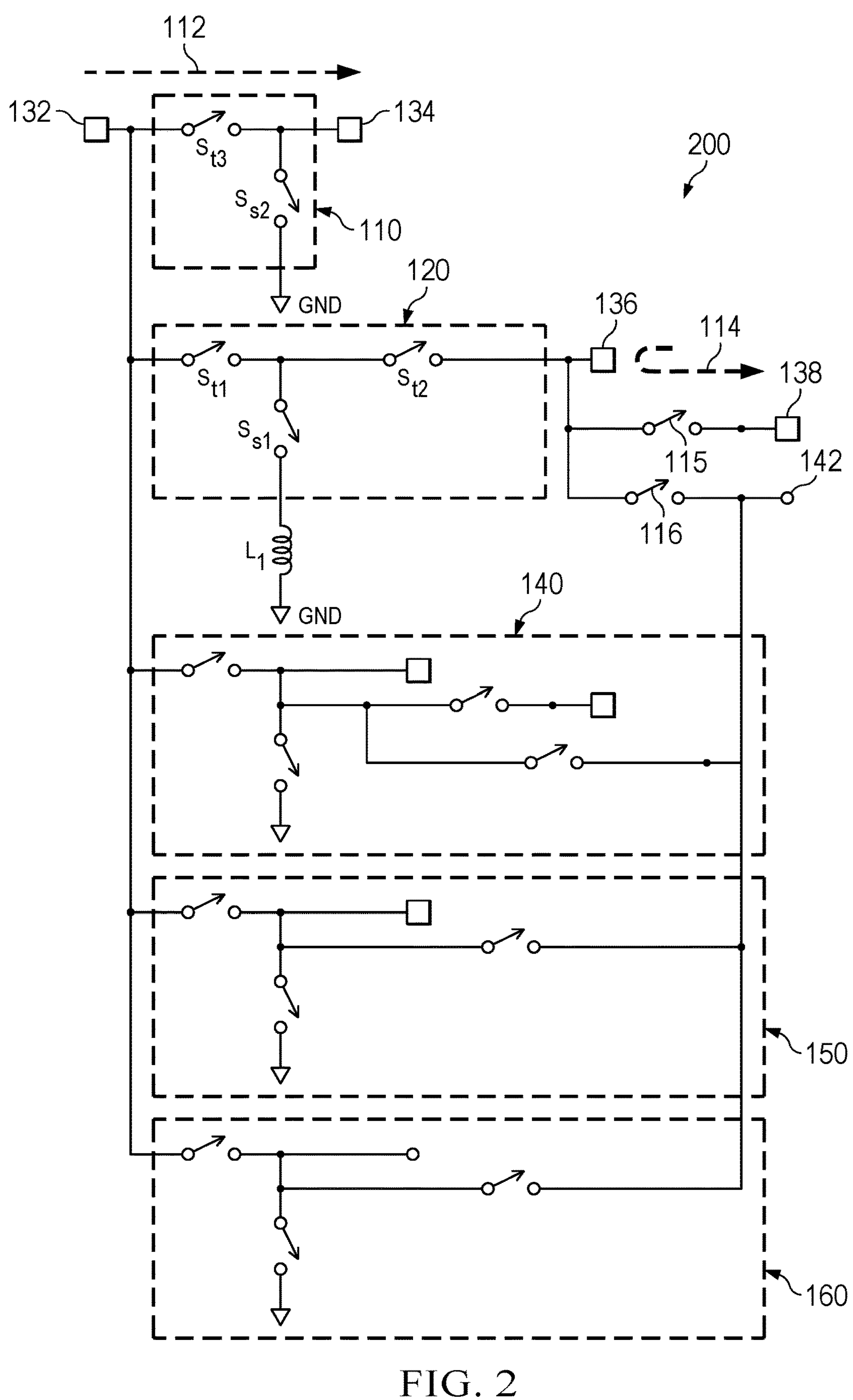
FIG. 2 is another example RF switching circuit, in accordance with one or more embodiments of the present disclosure.

FIG. 2 is another example RF switching circuit 200, in accordance with one or more embodiments of the present disclosure. The RF switching circuit 200 in FIG. 2 is similar to the RF switching circuit 100 of FIG. 1, except for the presence of inductor $L_1$ as shown. Also as shown, the inductor $L_1$ is connected in series with the shunt branch $S_{s1}$, with the inductor $L_1$ connected between the shunt branch $S_{s1}$ and ground GND. By including inductor $L_1$, isolation can be improved between signal paths 112 and 114 over a desired frequency band and bandwidth. The inductor $L_1$, as well as the other inductors disclosed herein, can be implemented in a number of ways, including as a surface mount device (SMD) component or a long route in a package (such as a wire or other type of connection or combination of connections such as wire plus via). The inductance of any of these inductors may be calculated to achieve a desired isolation, such as greater than 60 dB, in a frequency band of interest, such as band in frequencies greater than 1 GHz. For example, the inductance of any of the inductors of interest may have a material inductance (e.g., greater than 1 nH, 2 nH, 5 nH, etc.) at high operating frequencies. All portions of the RF switching circuit 200 may be implemented on an integrated circuit, and the inductor $L_1$ may be implemented on the integrated circuit or may be located external to the integrated circuit. For example, in some embodiments, all or part of the RF switching circuit 200 may be part of a module or package, which is attached to a printed circuit board (PCB) as part of a larger system. A module or package may include an interposer. Thus, in some embodiments, all portions of the RF switching circuit 200, except for the inductor $L_1$, may be located on an integrated circuit, which is, in turn, part of a module or package, and the inductor $L_1$ may be located in or on the interposer or in or on the PCB. The use of an inductor may obviate the need for expensive filters or other components for achieving a desired isolation.

Figure 3:
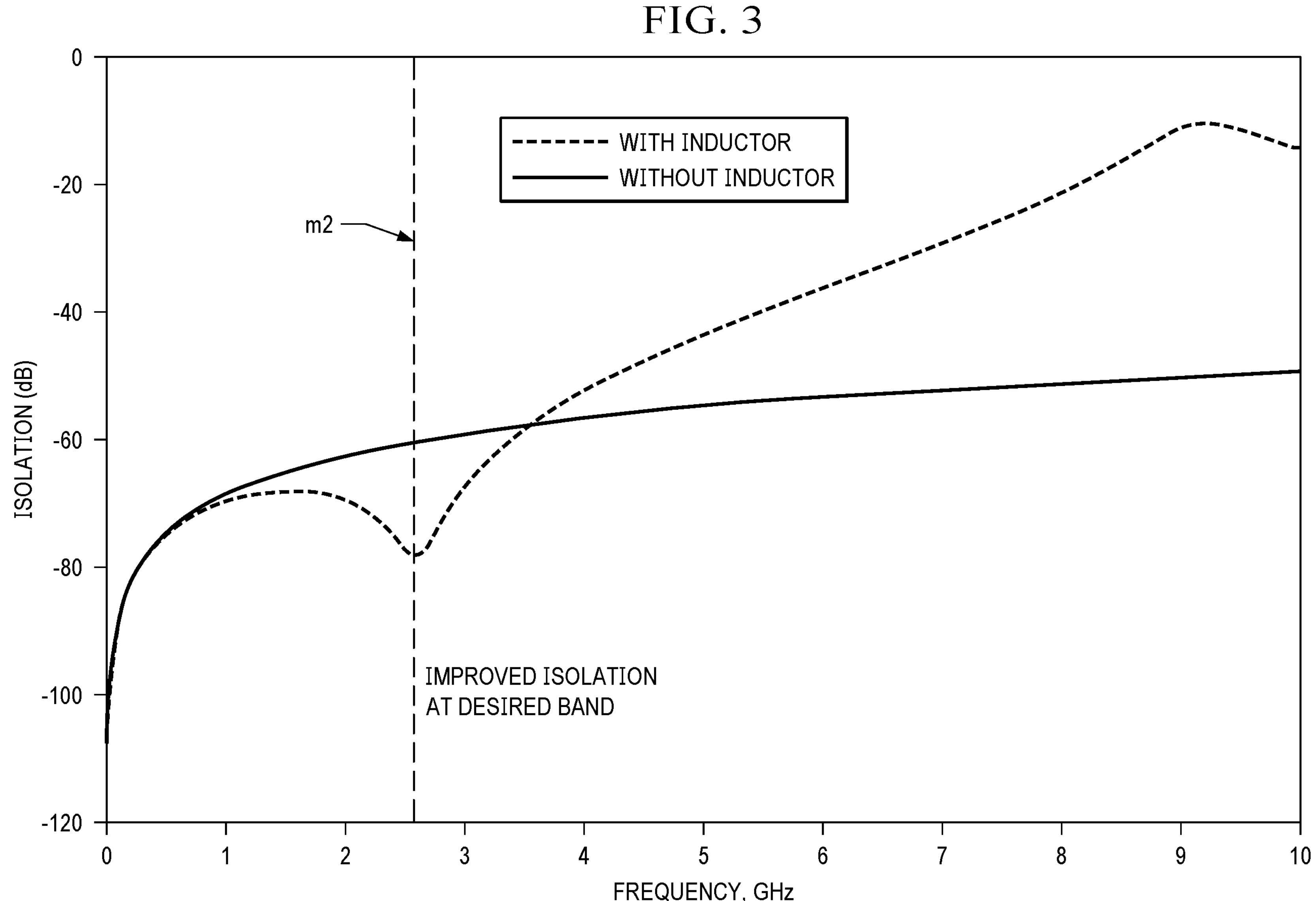
FIG. 3 illustrates isolation versus frequency for two RF switching circuit configurations, in accordance with one or more embodiments of the present disclosure.

FIG. 3 illustrates isolation (in dB) versus frequency (in gigahertz (GHz)) simulated for two RF switching circuit configurations, in accordance with one or more embodiments of the present disclosure. The solid curve represents isolation results for an RF switching circuit with no inductor connected on a shunt branch, such as the circuit 100 in FIG. 1. The dashed curve represents isolation results for an RF switching circuit having an inductor connected on a shunt branch, such as the circuit 200 in FIG. 2. As shown in FIG. 3, the expected isolation in a desired band of interest is significantly greater for the RF switching circuit having an inductor on the shunt branch, with the expected isolation being nearly 78 dB around 2.57 GHz. The isolation null around 2.57 GHz is nearly equal to the isolation that could be achieved in the ideal case when there is no parasitic capacitance between paths 112 and 114. Measurements taken using circuits similar to FIG. 2 are consistent with simulated values of isolation.

Figure 4A:
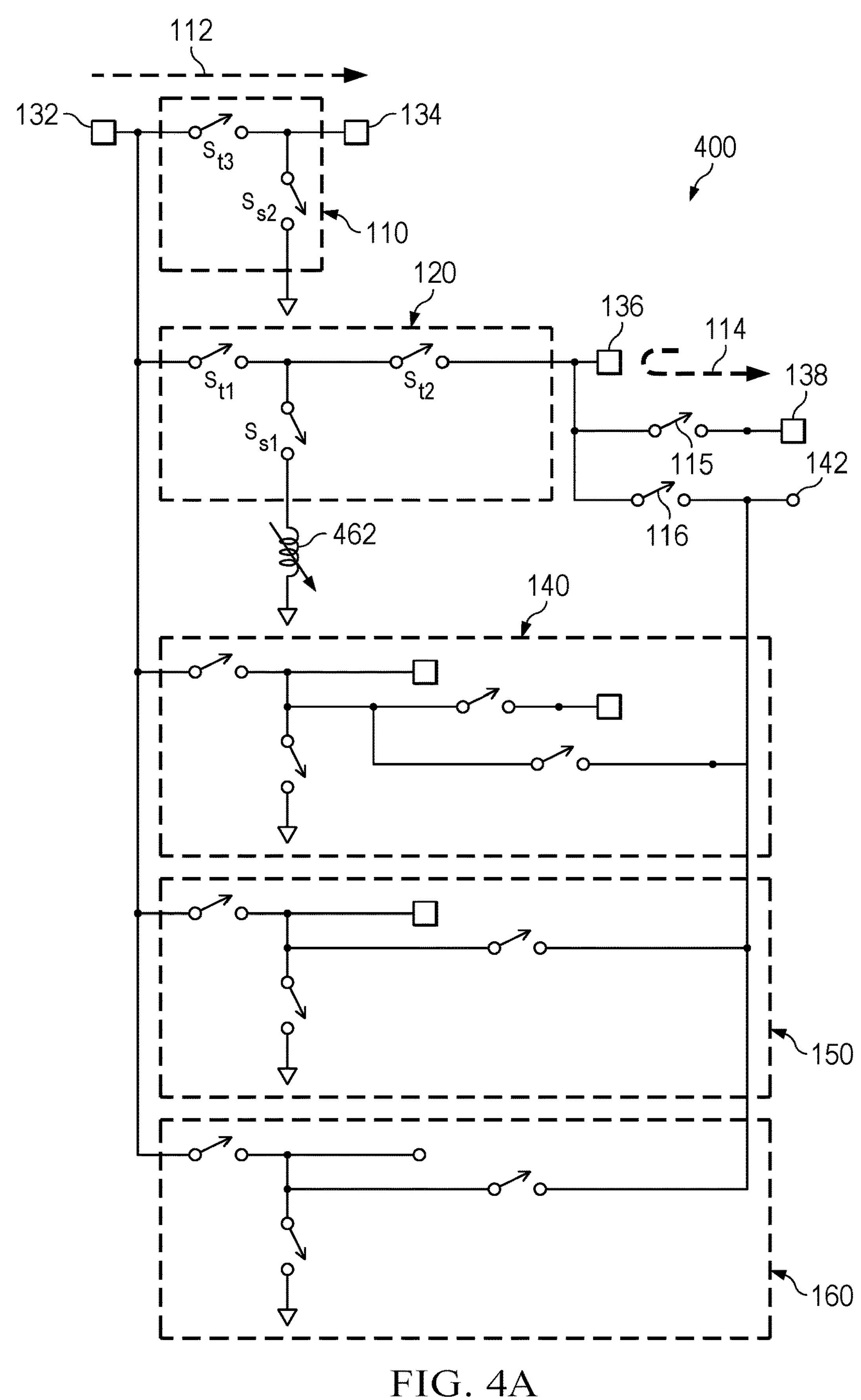
FIG. 4A is an example RF switching circuit having a configurable inductor circuit and FIGS. 4B-4D are example embodiments of the configurable inductor circuit, in accordance with one or more embodiments of the present disclosure.
Figure 4B:
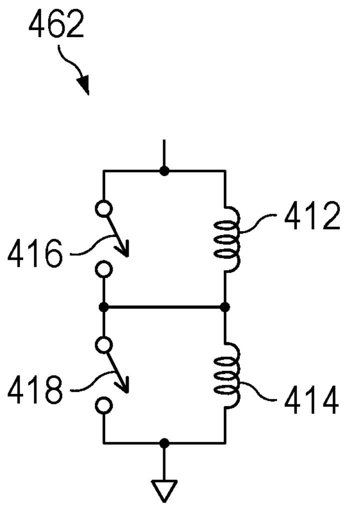
Figure 4C:
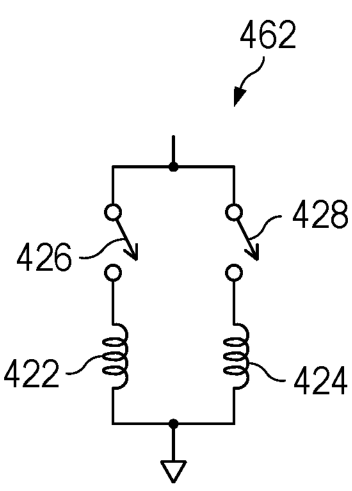
Figure 4D:
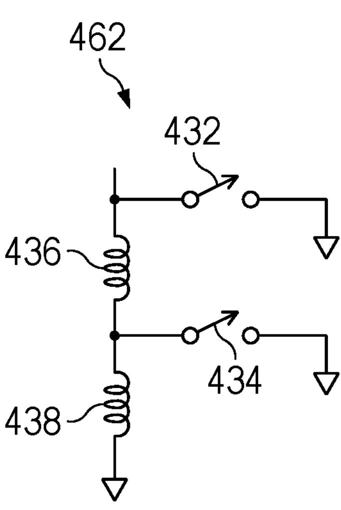

FIG. 4A is an example RF switching circuit 400 having a configurable inductor circuit 462, and FIGS. 4B-4D are example embodiments of the configurable inductor circuit 462, in accordance with one or more embodiments of the present disclosure. The RF switching circuit 400 in FIG. 4A is similar to the RF switching circuit 100 of FIG. 1, except for the addition of configurable inductor circuit 462 as shown. The configurable inductor circuit 462 improves isolation between signal paths 112 and 114 over some bandwidth. The configurable inductor circuit 462 can be configured into different inductor configurations having different inductances, according to the needs of the application. For example, the isolation shaping frequency range (or null) can be adapted or designed for different frequency bands of interest.

FIGS. 4B-4D are example embodiments of the configurable inductor circuit 462. The configurable inductor circuit embodiment 462 in FIG. 4B includes two inductors 412 and 414 connected in series as shown and bypass switches 416 and 418 connected in series. The inductance of configurable inductor circuit 462 in FIG. 4B can be set according to the states of the switches. The inductance of configurable inductor circuit 462 in FIG. 4B can be set to the inductance of inductor 412 if switch 416 is open and switch 418 is closed. The inductance of configurable inductor circuit 462 in FIG. 4B can be set to the inductance of inductor 414 if switch 416 is closed and switch 418 is open.

Likewise, the inductance of configurable inductor circuit 462 in FIG. 4C can be set according to the inductance of inductor 422 or inductor 424, or inductor 422 in parallel with 424, depending on the states of switches 426 and 428. Similarly, the inductance of configurable inductor circuit 462 in FIG. 4D can be set to zero (if switch 432 is closed), the inductance of inductor 436 (if switch 432 is open and switch 434 is closed), or the inductance of inductors 436 and 438 connected in series (if switches 432 and 434 are open). The configurable inductor circuits 462 are example embodiments, and there are other known ways to achieve a tunable or configurable inductance. The inductors illustrated in FIG. 4B-4D can be implemented on-chip (e.g., on an integrated circuit) with the remainder of the RF switching circuit 400 on the same chip, or the inductors can be some mix of on and off-chip inductors, or all inductors may be located off-chip. For example, inductor 412 can be located on-chip and inductor 414 can be located off-chip. As another example, both inductors 436 and 438 can be located off-chip. In general, as inductance increases in these configurations, the frequency of isolation decreases. For example, the notch in the dashed curve would move to the left as inductance increases.

Figure 5:
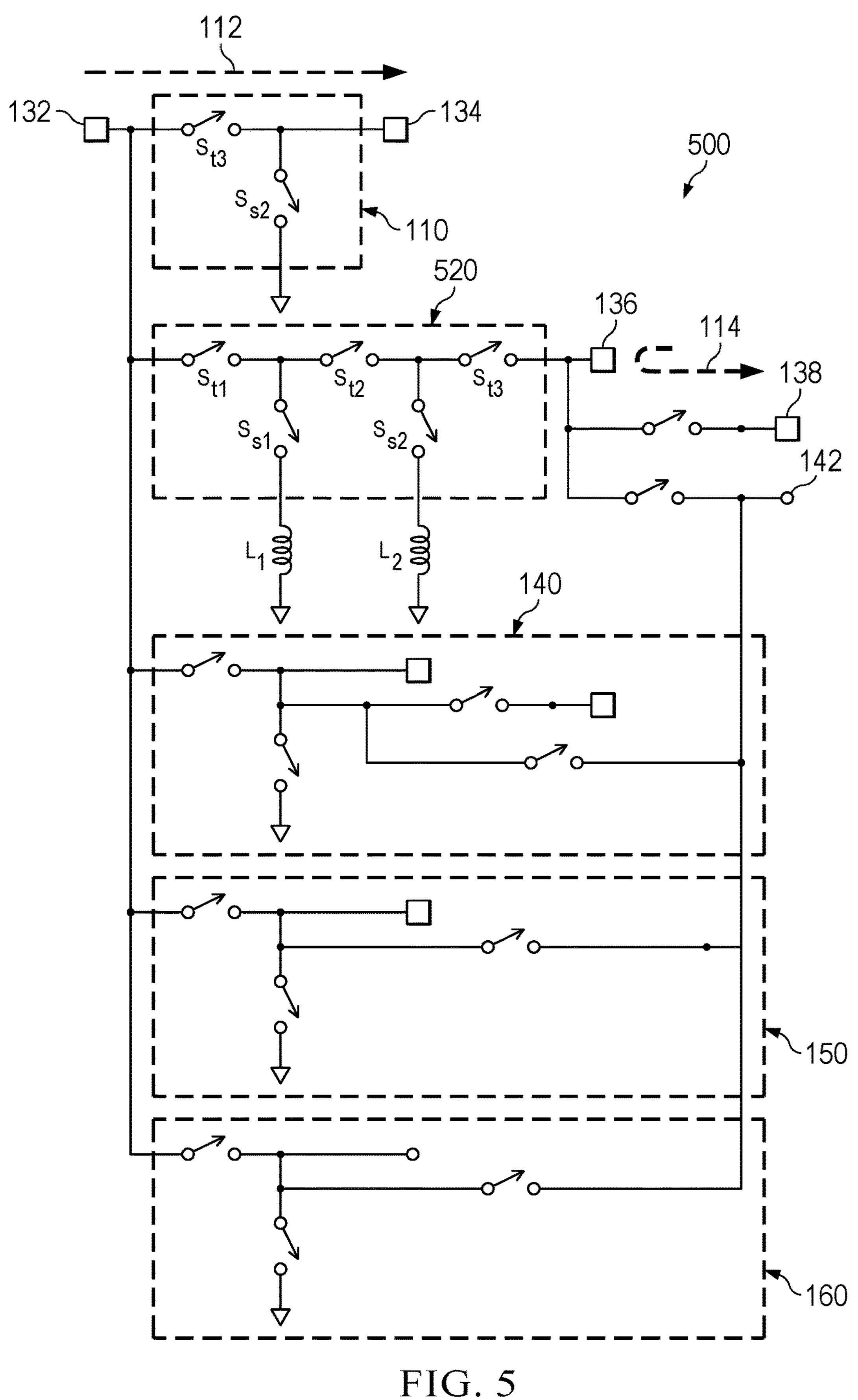
FIG. 5 is another example RF switching circuit, in accordance with one or more embodiments of the present disclosure.

FIG. 5 is another example RF switching circuit 500, in accordance with one or more embodiments of the present disclosure. The RF switching circuit 500 includes a second switch group 520 and inductors $L_1$ and $L_2$. The RF switching circuit 500 is similar to the RF switching circuit 100 of FIG. 1, except that second switch group 520 and inductors $L_1$ and $L_2$ are used instead of second switch group 120 in FIG. 1. The second switch group 520 represents a through-shunt-through-shunt-through configuration or topology, using through switches $S_{t1}$, $S_{t2}$, and $S_{t3}$, and shunt switches $S_{s1}$ and $S_{s2}$ as shown. When the RF switching circuit 500 is configured to connect RF signal path 112 and RF signal path 114, the inductors $L_1$ and $L_2$ improve isolation between these paths 112 and 114 when through switches $S_{t1}$, $S_{t2}$, and St are set in an off state, and shunt switches $S_{s1}$ and $S_{s2}$ are set in an on state. The second switch group 520 topology can be used to widen the isolation null. The concept of adding an additional shunt branch can be extended to add additional shunt branches for improved isolation over an even wider bandwidth. Some embodiments provide a single switching circuit capable of supporting wide and/or multiple bandwidths.

In some embodiments, inductors $L_1$ and $L_2$ should be designed so that inductance values do not resonate with the off-cap of the shunt branches when the shunt switches $S_{s1}$ and $S_{s2}$ are off, when port 132 is connected to port 136 to form a signal path between these nodes.

Figure 6:
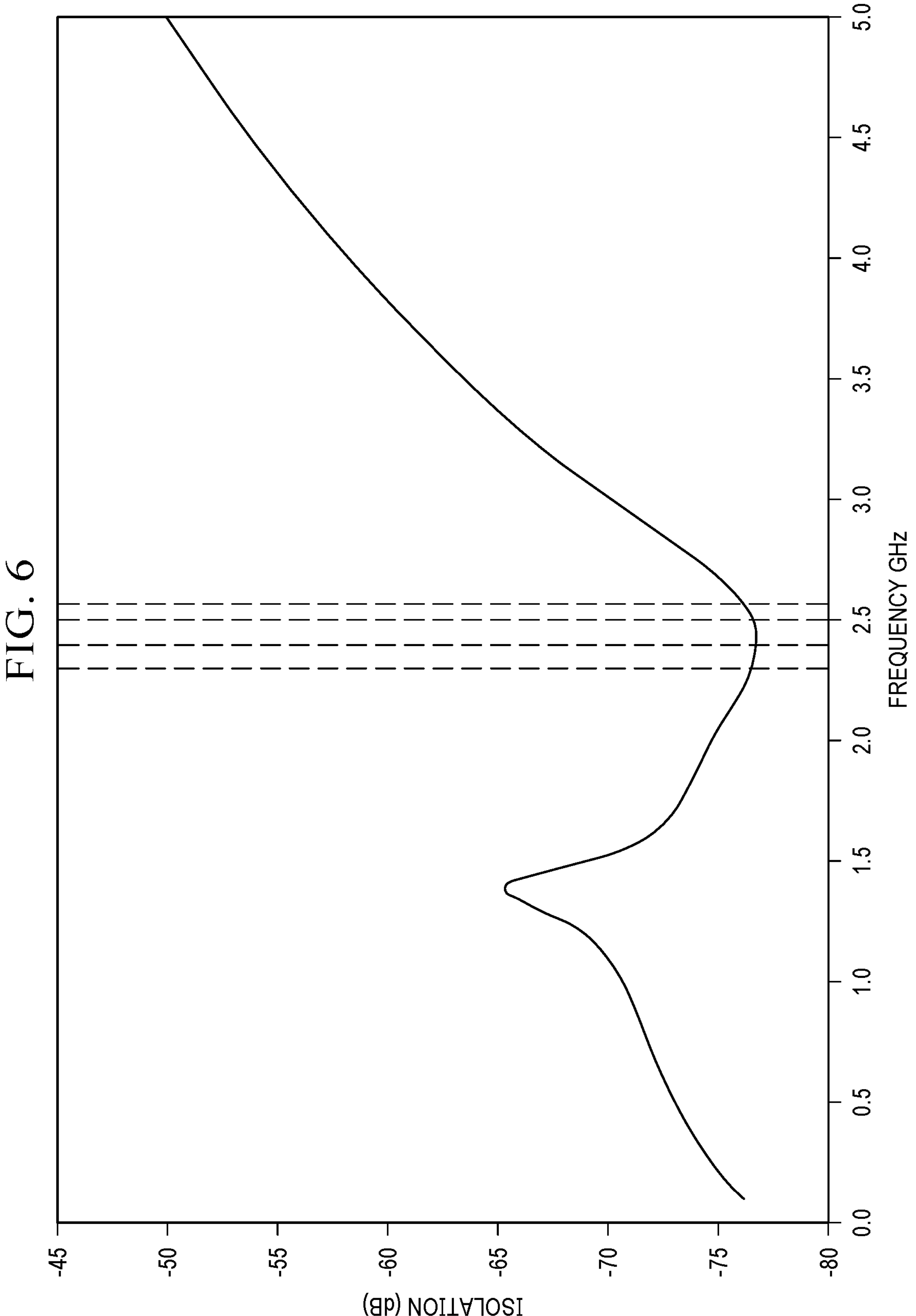
FIG. 6 illustrates isolation versus frequency for a RF switching circuit, in accordance with one or more embodiments of the present disclosure.

FIG. 6 illustrates isolation versus frequency for the RF switching circuit 500, in accordance with one or more embodiments of the present disclosure. The results presented in FIG. 6 represent simulation results. As shown, greater than 75 dB of isolation can be achieved between paths 112 and 114 in FIG. 6 over a band encompassing 2.3 GHz to 2.57 GHz.

Figures 7, 8:
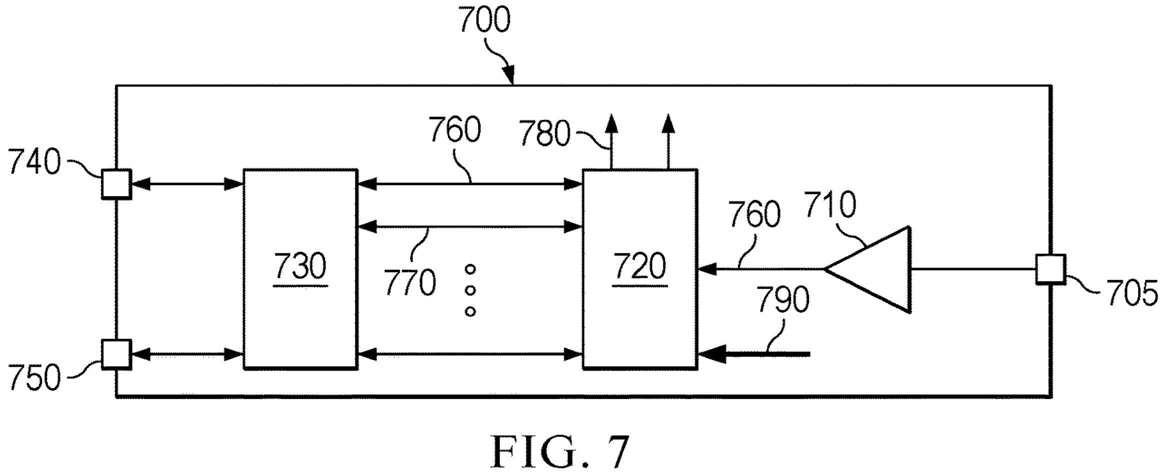
FIG. 7 is an example integrated circuit, in accordance with one or more embodiments of the present disclosure.
FIG. 8 is an example wireless communication device, in accordance with one or more embodiments of the present disclosure.

FIG. 7 is an example integrated circuit 700, in accordance with one or more embodiments of the present disclosure. As shown, the integrated circuit 700 includes RF switching circuit 720 connected to an antenna multiplexer 730. The integrated circuit 700 further includes a plurality of antenna ports. In this example, the integrated circuit 700 includes antenna ports 740 and 750. The integrated circuit further includes a signal port 705 and a power amplifier 710. Amplifier 710 may include a power amplifier or an LNA. In some embodiments, amplifier 710 may be integrated on a die or integrated circuit with switching circuit 720 or may be provided on a separate die or module.

In this example, the signal port 705 receives a signal to be transmitted. RF switching circuit 720 is connected to various signal paths, including signal paths 760 and 770, and output signals paths, including signal path 780. For example, a received signal in a first RF band, such as band B40 in a 4G or 5G cellular wireless application, may be received via one of the antenna ports 740, 750 and over a path, such as path 770. The received signal may be routed to signal path 780 by RF switching circuit 720. The RF switching circuit 720 may be, as examples, any of RF switching circuits 200, 400, or 500 in FIG. 2, 4A, or 5, respectively. In some embodiments, control signals 790 may be input to RF switching circuit 720 to set the states of the various switches, thereby establishing certain signal paths for routing RF signals and setting the state of various shunt circuits or switch groups. For example, if RF switching circuit 720 is implemented using the topology of FIG. 2, 4A, or 5, the control signals 790 may control the states of all switches shown in FIG. 2, 4A, or 5.

In some embodiments, RF switching circuit 720 may be implemented on an IC with one more additional RF functional blocks including an amplifier, such as a power amplifier (PA) or an low noise amplifier (LNA), a coupler, analog circuitry, etc. In addition, in some embodiments, RF switching circuit 720 may be provided on an IC within an RF module such as a PA module (PAM), a PA with Duplexer Module (PAD), a PA with integrated Duplexer module (PAID), power amplifier module with integrated diplexers (PAMID), LNA plus power amplifier module with integrated diplexers (LPAMID), power amplifier module with integrated filters (PAMiF), or LPAMiF Also, a module could include RF switching capability such as a discrete antenna and/or band select switch. One or more of these modules may be arranged to provide an RF transmit chain of an RF transceiver for a wireless communication device. In some embodiments, the RF switching circuit 720 may be implemented as a band select switch IC in a band switch select circuit, such as an a LPAMID module.

FIG. 8 is a cross-sectional simplified view of an integrated circuit assembly 800, in accordance with one or more embodiments of the present disclosure. In some embodiments, the integrated circuit assembly 800 includes a package or module 840. The package or module 840 may include an integrated circuit 810 and an interposer 820. The package 840 may include one or more additional interconnected integrated circuits (not shown) as is known in the art. The integrated circuit 810 may include an RF switching circuit 802, such as any of the RF switching circuits disclosed herein. One or more inductors 804 may be connected to, or part of, the RF switching circuit 802. Various locations for an inductor 804 are illustrated in FIG. 8, indicating that an inductor 804 may be electrically connected to the RF switching circuit 802 regardless of where the inductor 804 is located in the integrated circuit assembly 800. For example, the RF switching circuit 802 may be connected to an inductor 804 by a via, a bump, a hybrid bond pad, or other connection. As an example, the RF switching circuit 802 may implement the RF switching circuit 200, except for inductor $L_1$. In such an embodiment, the inductor $L_1$ may be located on or in the interposer 820 or on or in the PCB as shown by inductors 804 in FIG. 8, and inductor $L_1$ together with the remaining portion of the RF switching circuit 200 may form an RF switching circuit. As another example, the inductor $L_1$ may be located on the PCB 830 next to the package 840. Where embodiments or designs call for two or more inductors (such as illustrated in FIG. 5), one inductor may be located (e.g., printed) on the IC 810, and another inductor may be located on or in the interposer 820 or on or in the PCB 830. In other words, multiple inductors may be placed and connected in various different locations within the integrated circuit assembly 800. The inductors for the other RF switching circuit embodiments disclosed herein may be similarly placed. The interposer 820 may electrically connected to the PCB 830 via any known technique, such as via the use of wire bonds or ball grid arrays.

Figure 9:
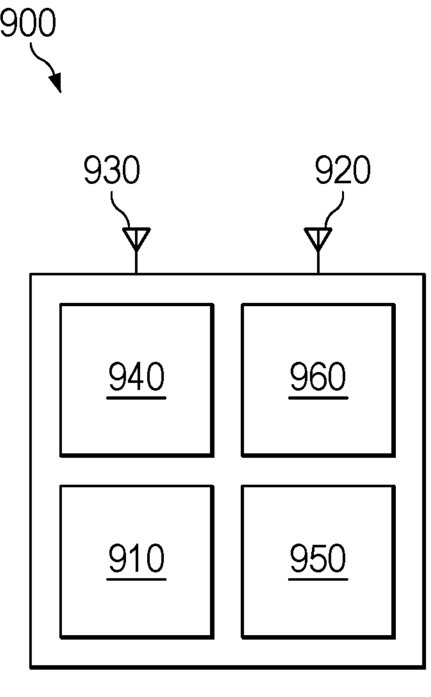
FIG. 9 is an example wireless communication method, in accordance with one or more embodiments of the present disclosure.

FIG. 9 is an example wireless communication device 900, in accordance with one or more embodiments of the present disclosure. The wireless communication device 900 includes integrated circuit 950, RF circuitry 940, memory 960, and processor 910. In one embodiment, the integrated circuit 950 may implement an RF switching circuit, such as RF switching circuit 720 in FIG. 7. For example, the integrated circuit 950 may implement the integrated circuit 700 of FIG. 7. The integrated circuit 950 may be connected in a topology between processor 910 and RF circuitry 940. The integrated circuit 950 may be part of a package that may include other integrated circuits that are interconnected in a system, e.g., as discussed with respect to FIG. 8.

The wireless communication device 900 may further include at least one antenna, such as antennas 920 and 930. For example, the wireless communication device 900 may be configured to communicate using carrier aggregation, e.g., transmitting signals using band B7 in frequency division duplexing (FDD) mode while switching between receiving and transmitting in band B40 using time division duplexing (TDD). The memory 960 may be used for storage of data and program instructions. The memory 960 may include volatile and/or non-volatile memory or storage elements, may be implemented as a non-transitory computer-readable storage medium, and may be implemented as some combination of random access memory (RAM) and read-only memory (ROM).

Figure 10:
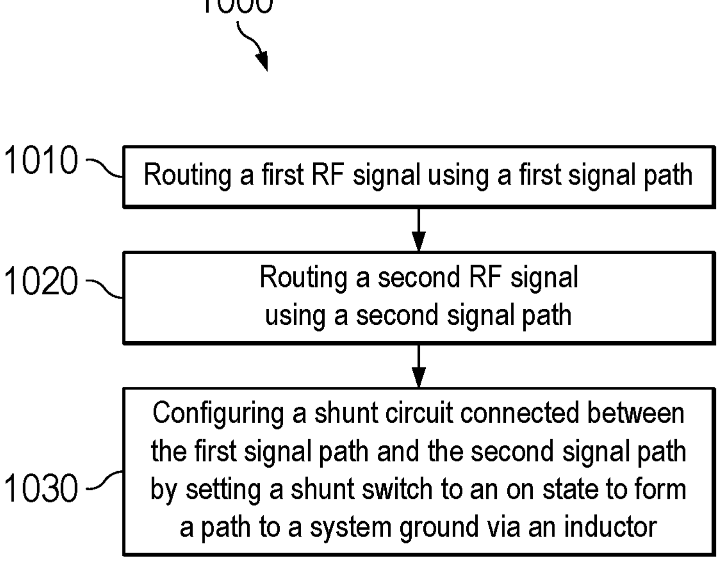
FIG. 10 is an example wireless communication method, in accordance with one or more embodiments of the present disclosure.

FIG. 10 is an example wireless communication method 1000, in accordance with one or more embodiments of the present disclosure. The wireless communication method 1000 may be performed by an RF switching circuit, such as the RF switching circuits presented in FIGS. 2, 4A, and 5. In step 1010, a first RF signal is routed using a first signal path. For example, an RF signal may be routed using RF signal path 112 presented in various embodiments herein. In step 1020, a second RF signal is routed using a second signal path. For example, an RF signal may be routed using RF signal path 114 presented in various embodiments herein. In step 1030, a shunt circuit connected between the first signal path and the second signal path is configured by setting a shunt switch to an on state to form a path to a system ground via an inductor. For example, the shunt circuit may be configured using the through-shunt-through throw topologies presented herein, such as with respect to second switch group 120. As would be understood based on this disclosure, these steps are not necessarily performed in the order presented. For example, step 1030 may be performed prior to routing various signals, such as discussed with respect to steps 1010 and 1020.

The switches described herein, such as any through switch (e.g., $S_{t1}$, $S_{t2}$, etc.), shunt switch (e.g., $S_{s1}$, etc.), or other switch (e.g., switches 115, 116, etc.), may be implemented using transistors, such as field effect transistors (FETs). As understood in the art, a gate voltage can be used to control the state of a transistor switch, such as a FET switch, to set the switch in an on or off state. For example, control signals, such as control signals 790, may be used to control and set the states of the various switches to route RF signals within a device, according to the needs of the device.

Further aspects of the present disclosure include the following:

Aspect 1 includes a RF switching circuit comprising: a first switchable signal path; a second switchable signal path; and a shunt circuit connected between the first switchable signal path and the second switchable signal path, wherein the shunt circuit comprises a shunt switch; and an inductor connected in series with the shunt switch.

Aspect 2 includes the RF switching circuit of aspect 1, wherein the shunt circuit further comprises a first switch and a second switch connected in series, and wherein the shunt switch comprises an input connected between the first switch and the second switch and an output connected to the inductor.

Aspect 3 include the RF switching circuit of any of aspects 1-2, further comprising a second inductor, wherein the inductor and the second inductor are configurable into a plurality of inductor configurations.

Aspect 4 includes the RF switching circuit of aspect 2, wherein the shunt circuit further comprises: a third switch connected in series with the first switch and the second switch; and a second shunt switch, wherein the RF switching circuit further comprises: a second inductor, wherein the second shunt switch comprises a second input connected between the second switch and the third switch and a second output connected to the second inductor.

Aspect 5 includes the RF switching circuit of aspect 2, wherein the first switchable signal path is configured to route a first signal occupying a first frequency band greater than 2 gigahertz (GHz), wherein the second switchable signal path is configured to route a second signal occupying a second frequency band greater than 2 GHz, and wherein the shunt circuit is configurable to provide greater than 60 decibels of isolation between the first switchable signal path and the second switchable signal path for the first frequency band and the second frequency band, respectively.

Aspect 6 includes the RF switching circuit of aspect 2, wherein the RF switching circuit is implemented as an integrated circuit.

Aspect 7 includes a wireless communication device comprising: the RF switching circuit of aspect 2; a first antenna; and a second antenna, wherein RF switching circuit is configured to route a first signal occupying a first RF band to the first antenna using the first switchable signal path and to route a second signal occupying a second RF band from the second antenna using the second switchable signal path.

Aspect 8 includes the wireless communication device of aspect 7, wherein the first RF band is a first Long Term Evolution (LTE) frequency band, and wherein the second RF band is a second LTE frequency band.

Aspect 9 includes an integrated circuit assembly comprising the RF switching circuit of aspect 1; an integrated circuit, wherein the integrated circuit comprises the first switchable signal path, the second switchable signal path, and the shunt circuit; an interposer, wherein the inductor is located on the interposer; and a printed circuit board coupled to the integrated circuit via the interposer.

Aspect 10 includes in integrated circuit assembly comprising: the RF switching circuit of aspect 1; an integrated circuit, wherein the integrated circuit comprises the first switchable signal path, the second switchable signal path, and the shunt circuit; an interposer; and a printed circuit board coupled to the integrated circuit via the interposer, wherein the inductor is located on the printed circuit board.

Aspect 11 includes a device comprising: the RF switching circuit of claim 4; an integrated circuit, wherein the integrated circuit comprises the first switchable signal path, the second switchable signal path, the shunt circuit, and the inductor; an interposer; and a printed circuit board coupled to the integrated circuit via the interposer, wherein the second inductor is located on the interposer or on the printed circuit board.

Aspect 12 includes a radio frequency (RF) circuit comprising: a RF switching circuit comprising: a common port; a first switch group connected between the common port and a first output port; a configurable RF signal path; and a second switch group connected between the common port and the configurable RF signal path, wherein the second switch group comprises a shunt switch; and at least one inductor comprising an inductor, wherein the shunt switch is configurable to form a shunt path via the inductor.

Aspect 13 includes the RF circuit of aspect 12, wherein the second switch group further comprises a pair of switches connected in series between the common port and the configurable RF signal path, and wherein the shunt switch comprises an input connected between the pair of switches and an output connected to the inductor.

Aspect 14 includes the RF circuit of aspects 12-13, wherein the at least one inductor further comprises a second inductor, and wherein the at least one inductor is configurable into a plurality of inductor configurations.

Aspect 15 includes the RF circuit of aspects 12, wherein the second switch group further comprises: a third switch connected in series with the pair of switches; and a second shunt switch, wherein the at least one inductor further comprises a second inductor, and wherein the second shunt switch comprises a second input connected between the pair of switches and the third switch and a second output connected to the second inductor.

Aspect 16 includes an integrated circuit comprising: the RF circuit of aspect 13; a plurality of antenna ports comprising a first antenna port and a second antenna port; a signal port; and a power amplifier, wherein the power amplifier is connected between the signal port and the common port, and wherein the RF switching circuit is configurable to form a transmit signal path from the signal port to the first antenna port via the common port and to connect the second antenna port to the configurable RF signal path.

Aspect 17 includes the integrated circuit of aspect 16, wherein the transmit signal path is configured to carry a first signal in a first Long Term Evolution (LTE) frequency band, and wherein the configurable RF signal path is configured to carry a second signal in a second LTE frequency ban.

Aspect 18 includes the RF circuit of aspect 13, wherein the RF switching circuit is implemented as an integrated circuit.

Aspect 19 includes the RF circuit of aspect 13, wherein the at least one inductor further comprises the inductor and a switchable bypass second inductor.

Aspect 20 includes the RF circuit of any of aspects 12-15, further comprising a plurality of switchable signal paths connected between the common port and a second output port.

Aspect 21 includes a method of routing radio frequency (RF) signals comprising: routing a first RF signal using a first signal path; routing a second RF signal using a second signal path; and configuring a shunt circuit connected between the first signal path and the second signal path, wherein the shunt circuit comprises a pair of switches connected in series and a shunt switch, and wherein the configuring comprises setting the shunt switch to an on state to form a path to a system ground via an inductor.

Aspect 22 includes the method of aspect 21, wherein a configurable inductor circuit comprises the inductor, wherein the configurable inductor circuit is configurable into one of a plurality of inductor configurations, and wherein the method further comprises configuring the configurable inductor circuit into one of the plurality of inductor configurations.

Aspect 23 includes the method of any of aspects 21-22, wherein the first RF signal and the second RF signal are different carriers in a wireless communication device employing carrier aggregation.

Programmable Embodiments

Some or all aspects of the disclosure, particularly the wireless communication device 800 of FIG. 8, may be implemented in hardware or software, or a combination of both (e.g., programmable logic arrays). Unless otherwise specified, the algorithms included as part of this disclosure are not inherently related to any particular computer or other apparatus. In particular, various general purpose computing machines may be used with programs written in accordance with the teachings herein, or it may be more convenient to use a special purpose computer or special-purpose hardware (such as integrated circuits) to perform particular functions. Thus, embodiments herein may be implemented in one or more computer programs (i.e., a set of instructions or codes) executing on one or more programmed or programmable computer systems (which may be of various architectures, such as distributed, client/server, or grid) each comprising at least one processor, at least one data storage system (which may include volatile and non-volatile memory and/or storage elements), at least one input device or port, and at least one output device or port. Program instructions or code may be applied to input data to perform the functions described in this disclosure and generate output information. The output information may be applied to one or more output devices in known fashion.

Each such computer program may be implemented in any desired computer language (including machine, assembly, or high-level procedural, logical, or object-oriented programming languages) to communicate with a computer system, and may be implemented in a distributed manner in which different parts of the computation specified by the software are performed by different computers or processors. In any case, the computer language may be a compiled or interpreted language. Computer programs implementing some or all of the embodiments may form one or more modules of a larger program or system of programs. Some or all of the elements of the computer program can be implemented as data structures stored in a computer readable medium or other organized data conforming to a data model stored in a data repository.

Each such computer program may be stored on or downloaded to (for example, by being encoded in a propagated signal and delivered over a communication medium such as a network) a tangible, non-transitory storage media or device (e.g., solid state memory media or devices, or magnetic or optical media) for a period of time (e.g., the time between refresh periods of a dynamic memory device, such as a dynamic RAM, or semi-permanently or permanently), the storage media or device being readable by a general or special purpose programmable computer or processor for configuring and operating the computer or processor when the storage media or device is read by the computer or processor to perform the procedures described above. The inventive system may also be considered to be implemented as a non-transitory computer-readable storage medium, configured with a computer program, where the storage medium so configured causes a computer or processor to operate in a specific or predefined manner to perform the functions described in this disclosure.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments can be implemented to meet a wide variety of specifications. Unless otherwise noted above, selection of suitable component values is a matter of design choice. Various embodiments may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments may be implemented in other transistor technologies such as bipolar, BiCMOS, LDMOS, BCD, GaAs HBT, GaN HEMT, GaAs pHEMT, and MESFET technologies. However, various embodiments may be particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for case of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the disclosure have been described. It is to be understood that various modifications may be made without departing from the spirit and scope of the disclosure. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the disclosure, which is defined by the scope of the following claims, and that other embodiments are within the scope of the claims. In particular, the scope of the disclosure includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency (RF) switching circuit comprising:

a first switchable signal path;

a second switchable signal path; and a shunt circuit connected between the first switchable signal path and the second switchable signal path, wherein the shunt circuit comprises a first switch and a second switch and a third switch all connected in series, a first shunt switch, and a second shunt switch;

an inductor connected in series with the first shunt switch; and a second inductor, wherein the first shunt switch comprises an input connected between the first switch and the second switch and an output connected to the inductor, and wherein the second shunt switch comprises a second input connected between the second switch and the third switch and a second output connected to the second inductor.

2. The RF switching circuit of claim 1, wherein the inductor and the second inductor are configurable into a plurality of inductor configurations.

3. The RF switching circuit of claim 1, wherein the first switchable signal path is configured to route a first signal occupying a first frequency band greater than 2 gigahertz (GHz), wherein the second switchable signal path is configured to route a second signal occupying a second frequency band greater than 2 GHz, and wherein the shunt circuit is configurable to provide greater than 60 decibels of isolation between the first switchable signal path and the second switchable signal path for the first frequency band and the second frequency band, respectively.

4. The RF switching circuit of claim 1, wherein the RF switching circuit is implemented as an integrated circuit.

5. A wireless communication device comprising:

the RF switching circuit of claim 1;

a first antenna; and a second antenna, wherein the RF switching circuit is configured to route a first signal occupying a first RF band to the first antenna using the first switchable signal path and to route a second signal occupying a second RF band from the second antenna using the second switchable signal path.

6. The wireless communication device of claim 5, wherein the first RF band is a first Long Term Evolution (LTE) frequency band, and wherein the second RF band is a second LTE frequency band.

7. An integrated circuit assembly comprising the RF switching circuit of claim 1;

an integrated circuit, wherein the integrated circuit comprises the first switchable signal path, the second switchable signal path, and the shunt circuit;

an interposer, wherein the inductor is located on the interposer; and a printed circuit board coupled to the integrated circuit via the interposer.

8. An integrated circuit assembly comprising:

the RF switching circuit of claim 1;

an integrated circuit, wherein the integrated circuit comprises the first switchable signal path, the second switchable signal path, and the shunt circuit;

an interposer; and a printed circuit board coupled to the integrated circuit via the interposer, wherein the inductor is located on the printed circuit board.

9. A device comprising:

the RF switching circuit of claim 1;

an integrated circuit, wherein the integrated circuit comprises the first switchable signal path, the second switchable signal path, the shunt circuit, and the inductor;

an interposer; and a printed circuit board coupled to the integrated circuit via the interposer, wherein the second inductor is located on the interposer or on the printed circuit board.

10. A radio frequency (RF) circuit comprising:

an RF switching circuit comprising:

a common port;

a first switch group connected between the common port and a first output port;

a configurable RF signal path; and a second switch group connected between the common port and the configurable RF signal path, wherein the second switch group comprises a shunt switch; and at least one inductor comprising an inductor, wherein the shunt switch is configurable to form a shunt path via the inductor, wherein the second switch group further comprises a pair of switches connected in series between the common port and the configurable RF signal path, and wherein the shunt switch comprises an input connected between the pair of switches and an output connected to the inductor, and wherein the second switch group further comprises:

a third switch connected in series with the pair of switches; and a second shunt switch, wherein the at least one inductor further comprises a second inductor, and wherein the second shunt switch comprises a second input connected between the pair of switches and the third switch and a second output connected to the second inductor.

11. The RF circuit of claim 10, wherein the at least one inductor is configurable into a plurality of inductor configurations.

12. An integrated circuit comprising:

the RF circuit of claim 10;

a plurality of antenna ports comprising a first antenna port and a second antenna port;

a signal port; and a power amplifier, wherein the power amplifier is connected between the signal port and the common port, and wherein the RF switching circuit is configurable to form a transmit signal path from the signal port to the first antenna port via the common port and to connect the second antenna port to the configurable RF signal path.

13. The integrated circuit of claim 12, wherein the transmit signal path is configured to carry a first signal in a first Long Term Evolution (LTE) frequency band, and wherein the configurable RF signal path is configured to carry a second signal in a second LTE frequency band.

14. The RF circuit of claim 10, wherein the RF switching circuit is implemented as an integrated circuit.

15. The RF circuit of claim 10, wherein the second inductor is a switchable bypass inductor.

16. The RF circuit of claim 10, further comprising a plurality of switchable signal paths connected between the common port and a second output port.

17. The RF switching circuit of claim 4, wherein the integrated circuit comprises an RF module.

18. The RF switching circuit of claim 17, wherein the RF module comprises a power amplifier module (PAM).

19. The RF switching circuit of claim 18, wherein the power amplifier module comprises a power amplifier with duplexer (PAD) module.

20. The RF switching circuit of claim 18, wherein the power amplifier module comprises a power amplifier module with integrated diplexers (PAMiD).

21. The RF switching circuit of claim 18, wherein the power amplifier module comprises a power amplifier module with integrated filters (PAMiF).

22. The RF switching circuit of claim 17, wherein the RF module comprises a low-noise amplifier plus power amplifier module with integrated diplexers (LPAMiD).

23. The RF switching circuit of claim 17, wherein the RF module includes a coupler.

* * * * *